United States Patent
Pineda De Gyvez et al.

(10) Patent No.: US 7,463,508 B2
(45) Date of Patent: Dec. 9, 2008

(54) SRAM TEST METHOD AND SRAM TEST ARRANGEMENT TO DETECT WEAK CELLS

(75) Inventors: Jose De Jesus Pineda De Gyvez, Eindhoven (NL); Mohamed Azimane, Eindhoven (NL); Andrei S Pavlov, Hillsboro, OR (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/720,314

(22) PCT Filed: Nov. 8, 2005

(86) PCT No.: PCT/IB2005/053677

§ 371 (c)(1),
(2), (4) Date: May 25, 2007

(87) PCT Pub. No.: WO2006/056902

PCT Pub. Date: Jun. 1, 2006

(65) Prior Publication Data

US 2008/0106956 A1   May 8, 2008

(30) Foreign Application Priority Data

Nov. 26, 2004   (GB) ............ 0426005.5

(51) Int. Cl.
  *G11C 11/00* (2006.01)
  *G11C 7/00* (2006.01)
  *G11C 29/00* (2006.01)
(52) U.S. Cl. ............ 365/154; 365/201
(58) Field of Classification Search ........ 365/154, 365/201
See application file for complete search history.

(56) References Cited

U.S. PATENT DOCUMENTS

| 5,559,745 | A | * | 9/1996 | Banik et al. ............ 365/201 |
| 5,835,429 | A | * | 11/1998 | Schwarz ............ 365/201 |
| 6,081,465 | A | * | 6/2000 | Wang et al. ............ 365/201 |
| 6,256,241 | B1 | * | 7/2001 | Mehalel ............ 365/201 |
| 6,614,701 | B2 | * | 9/2003 | Barnes et al. ............ 365/201 |

(Continued)

FOREIGN PATENT DOCUMENTS

WO   2004/081948 A1   9/2004

*Primary Examiner*—Amir Zarabian
*Assistant Examiner*—Michael J Weinberg
(74) *Attorney, Agent, or Firm*—Peter Zawilski (57) ABSTRACT

A method and a test arrangement for testing an SRAM having a first cell and a second cell coupled between a pair of bitlines is disclosed. In a first step, a data value is stored in the first cell being the cell under test (CUT), and its complement is stored in a second cell, being the reference cell. Next, the bitlines are precharged to a predefined voltage. Subsequently, the wordline of the reference cell is enabled for a predefined time period, for instance by providing the wordline with a number of voltage pulses. This causes a drop in voltage of the bitline coupled to the logic '0' node of the reference cell. In a subsequent step, the wordline of the CUT is enabled, which exposes the CUT to the bitline with the reduced voltage. This is equivalent to weakly overwriting the CUT. Finally, the data value in the CUT is evaluated. If the data value has flipped, the CUT is a weak cell. Cells with varying levels of weakness can be detected by varying the reduced voltage on the aforementioned bitline.

11 Claims, 5 Drawing Sheets

U.S. PATENT DOCUMENTS 6,778,450 B2    8/2004  Selvin et al.
7,075,838 B2 *  7/2006  Jeung et al. .................. 365/201
7,076,376 B1 *  7/2006  Weiss et al. ................... 702/64
7,200,057 B2 *  4/2007  Pineda De Gyvez
                        et al. .......................... 365/201

* cited by examiner

SRAM TEST METHOD AND SRAM TEST ARRANGEMENT TO DETECT WEAK CELLS

The present invention relates to a method for testing a static random access memory (SRAM) having a first cell and a second cell coupled between a first bitline and a second bitline, the first cell being responsive to a first wordline and the second cell being responsive to a second wordline.

The present invention further relates to a test arrangement for testing such a memory.

An SRAM is a memory chip that requires power to hold its contents, i.e. it retains data bits in its memory as long as power is being supplied. It is made up of a flip-flop circuit that lets current flow through one side or the other based on which one of two select transistors is activated. Unlike Dynamic RAM (DRAM), SRAM does not require refresh circuitry for periodically refreshing the cells. SRAM also provides faster access to data than DRAM. However, it also takes up more space, uses more power and tends to be more expensive than DRAM. SRAM is commonly used for a computer's cache memory and as part of the random access memory digital-to-analogue converter on a video card, for example.

Figure 1:
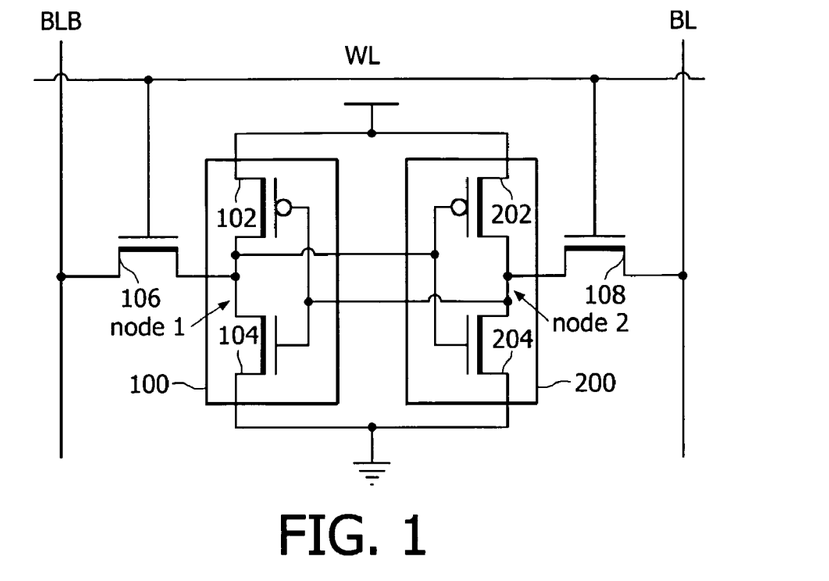
FIG. 1 is a circuit diagram showing the configuration of a conventional six-transistor SRAM cell.

FIG. 1 of the drawings illustrates a commonly used six-transistor (6T) CMOS SRAM cell. A first inverter 100 comprising a P-channel transistor 102 and an N-channel transistor 104, and a second inverter 200 comprising a P-channel transistor 202 and an N-channel transistor 204 are interconnected in a known fashion to form a latch. A first N-channel select transistor 106 couples the latch to a first bit line BLB and a second N-channel select transistor 108 couples the latch to a second bit line BL. The gates of the N-channel select transistors 106, 108 are coupled to a word line WL.

The six-transistor (6T) CMOS SRAM cell described above offers many advantages over the conventional four-transistor (4T) SRAM cell for microprocessor or microcontroller designs, including the potential for perfect data retention because of its active pull-up PMOS transistors. However, this perfect data retention potential has not previously been realized, because some defects, often called weak defects, are known to cause retention failures. This type of defect, typically caused by factors such as resistive defects, excessive process shifts, transistor mismatch, IR drops, etc., can cause unpredictable data retention failures that are process, temperature and time dependent. As such retention failure tends to be random because cells are not entirely damaged and retention failure (characterized by state flipping) is triggered only under certain operating conditions, such as electrical disturbance (e.g. power supply noise), read/write cell disturbance, etc. during normal operation of the SRAM. As a result, the conventional retention detection technique of high-temperature bakes and test algorithms such as N-March may not detect this type of fault.

Figure 2:
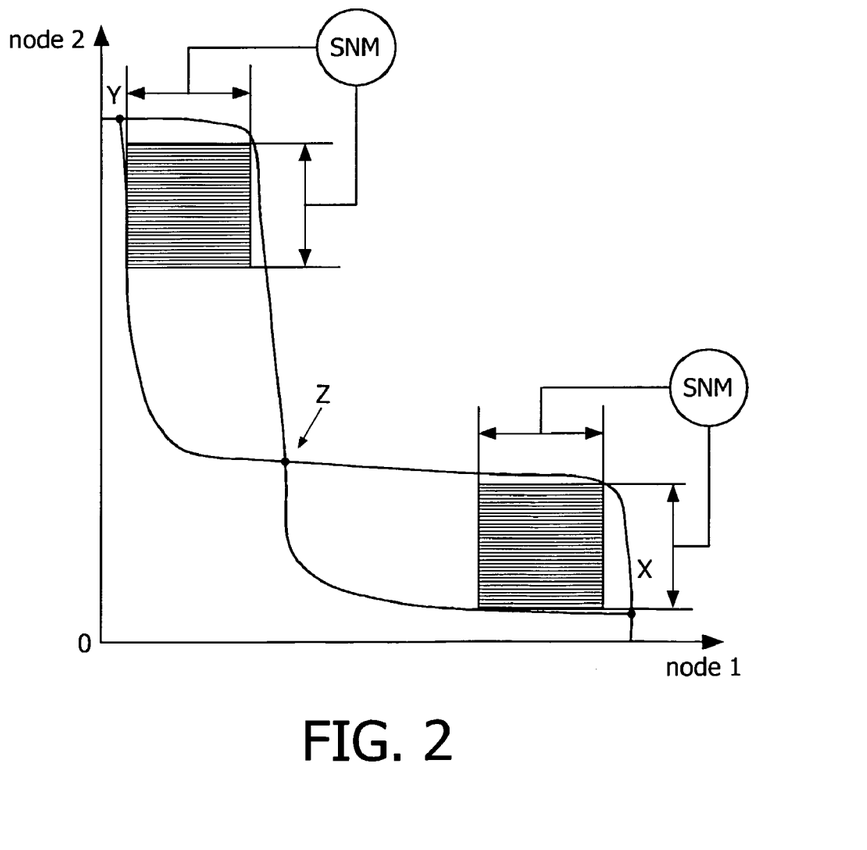
FIG. 2 shows a transfer function of a memory cell with highlighted static noise margins.

For the purpose of the following, weak cells can be defined as cells whose static noise margin (SNM) is close to zero. Consequently, such cells can inadvertently flip their state. SNM is a measure of the logic circuit's tolerance to noise in either of the states, i.e. by how much the input voltage can change without disturbing the present logic state. In other words, the SNM represents a measure of cell robustness. Referring to FIG. 2 of the drawings, there is illustrated a transfer function of a cell with highlighted static noise margins. The SNM is defined as the side of the maximum square that can be embedded between the transfer characteristics of the two cell inverters. Points X and Y on the characteristics represent two stable states and the intersection point Z represents the meta-stable point. A small disturbance around Z towards X or Y will cause the cell to flip to state X or Y respectively.

Figure 3:
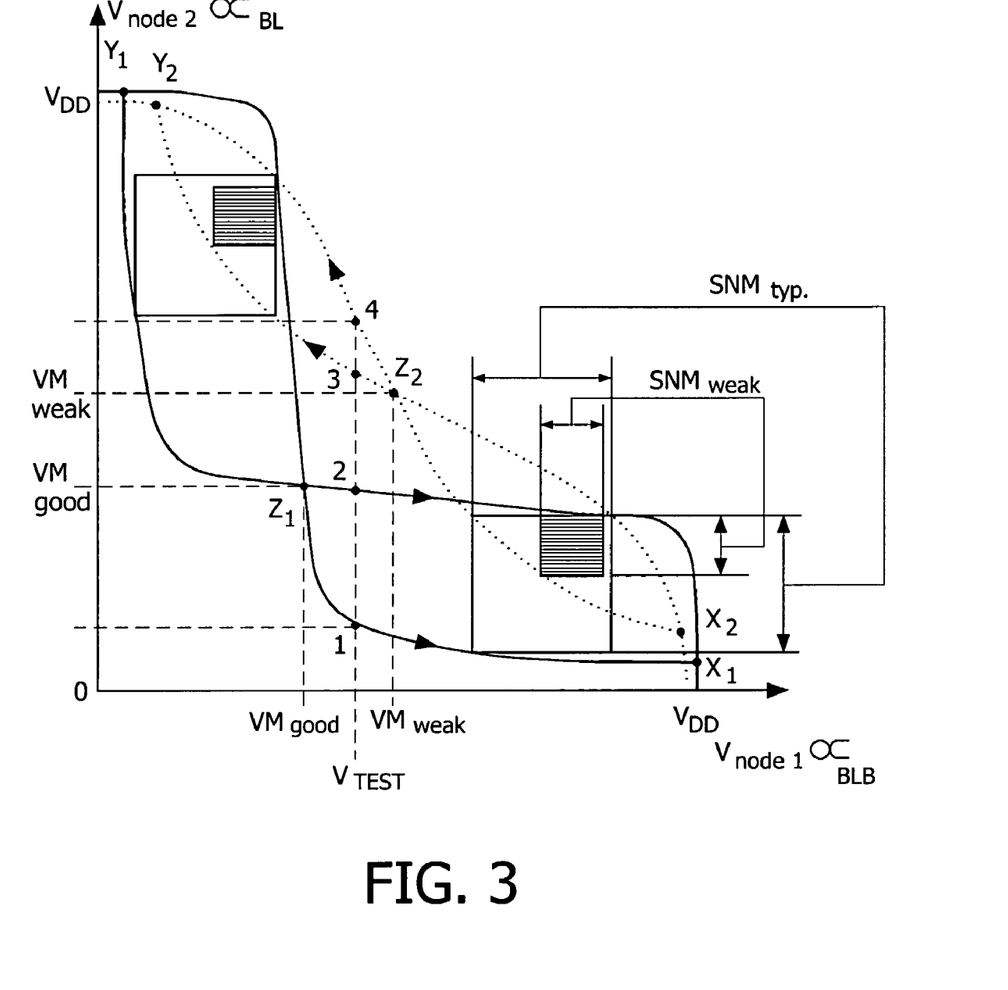
FIG. 3 shows the transfer functions of a good and weak SRAM cell respectively.

Referring to FIG. 3 of the drawings, there is illustrated the transfer characteristics of a good SRAM cell (solid line) and a weak SRAM cell (broken line). The axes represent the node voltages, which in turn are proportional to the bitline voltages. $VM_{good}$ and $VM_{weak}$ represent the metastability points of a good and a weak cell. If an SRAM cell internal node is brought to the level of VM, then a small voltage increment will flip the cell towards the direction of this increment. Points $X_1$, $Y_1$ ($X_2$, $Y_2$) on the transfer characteristic represent the stable states $Z_1$ ($Z_2$)—the metastable states of the good (weak) cell respectively. As is apparent from FIG. 3, the weak cell has a significantly smaller SNM than that of the good cell.

A problem with identifying weak cells in an SRAM is that not all cells have the same transfer characteristics, that is to say, the meta-stable points may vary between cells. The meta-stable points may also change due to technology and circuit design. U.S. Pat. No. 6,778,450 discloses an apparatus and method for the detection of weak cells having a range of transfer characteristics. To this end, a cell under test is coupled to a bias voltage generator, which can be configured by selecting a predefined bias voltage. Since different bias voltages enable the detection of different meta-stable points, a range of weak cells can be detected with this approach. However, a drawback of this solution is that a dedicated bias voltage generator has to be included in silicon, and that only bias voltage levels are available that have been predefined, which limits the flexibility of the weak cell test.

The present invention seeks to provide a method for testing an SRAM that provides an improvement over the prior art.

The present invention further seeks to provide a test arrangement for testing an SRAM that provides an improvement over the prior art.

According to a first aspect of the present invention, there is provided a method for testing a static random access memory having a first cell and a second cell coupled between a first bitline and a second bitline, the first cell being responsive to a first wordline and the second cell being responsive to a second wordline, the method comprising storing a data value in the first cell; storing the complement of the data value in the second cell; charging at least one of the first bitline and the second bitline to a predefined voltage; enabling the second wordline for a predefined time period; enabling the first wordline; and evaluating the data value stored in the first cell.

The invention is based on the realization that the bitline that is conductively coupled to the logic '0' of the second cell is partially discharged if the wordline of the second cell is disabled. The amount of charge lost by the bitline is time-dependent, i.e. a function of the period that the word line of the second cell is enabled, and consequently, the voltage drop on the bitline caused by the enabling of the word line of the second cell can be flexibly chosen. The exposure of the first cell to this reduced bitline voltage is equivalent to a weak overwrite of the first cell, and can therefore be used to determine the transfer characteristics of the first cell.

In an embodiment, enabling the second wordline for a predefined time period comprises providing the second wordline with N voltage pulses having a combined pulse width corresponding to the predefined time period, with N being an integer and being at least 2. This has the advantage that an existing signal such as a clock pulse or a similar signal can be applied to the word line of the second cell. Preferably, N and/or the pulse width can be selected, which allows for flexible testing of the memory under test, because the voltage reduction on the bit line can be altered after realizing the memory in silicon.

In a further embodiment, the method further comprises storing a further data value in the first cell; storing the complement of the further data value in the second cell; charging at least one of the first bitline and the second bitline to a further predefined voltage; enabling the second wordline for a further predefined time period; enabling the first wordline; and evaluating the further data value stored in the first cell. The variation of the predefined time period allows for the detection of a range of memory cells having varying SNMs.

In a yet further embodiment, the method of the present invention further comprises storing a second further data value in the first cell; storing the complement of the data value in the second cell; charging at least one of the first bitline and the second bitline to a predefined voltage; enabling the first wordline for a predefined time period; enabling the second wordline; and evaluating the data value stored in the second cell.

This has the advantage that the SNM of a cell used as reference can also be tested.

According to another aspect of the present invention, there is provided a test arrangement for testing a static random access memory having a first cell and a second cell coupled between a first bitline and a second bitline, the first cell being responsive to a first wordline and the second cell being responsive to a second wordline; the test arrangement comprising means for storing a data value in the first cell; means for storing the complement of the data value in the second cell; means for charging at least one of the first bitline and the second bitline to a predefined voltage; means for enabling the second wordline for a predefined time period; means for enabling the first wordline; and means for evaluating the data value in the first cell.

This arrangement, which may be embedded in the SRAM as a built-in-self-test (BIST) arrangement, implements the method of the present invention and benefits from the same advantages as disclosed for the method.

The present invention is described in more detail and by way of examples only and with reference to the accompanying drawings, in which.

It should be understood that the Figures are merely schematic and are not drawn to scale. It should also be understood that the same reference numerals are used throughout the Figures to indicate the same or similar parts.

Figure 4:
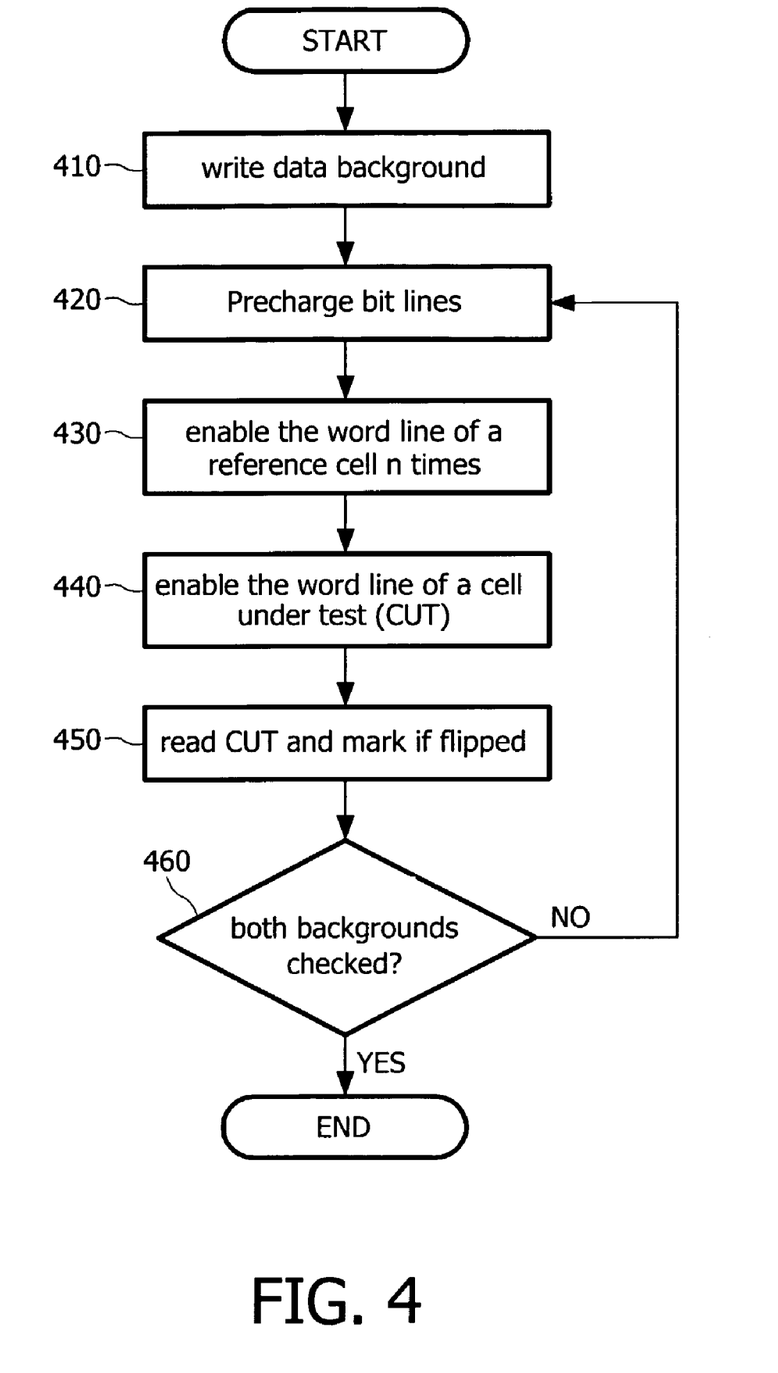
FIG. 4 shows a flowchart of the method of the present invention.

The method of the present invention is explained in FIG. 4 with the aid of FIGS. 1 and 3. In a first step 410, the data background is written to the SRAM cells, i.e. a first cell of the SRAM, which is the cell under test, is programmed with a first data value, e.g. a logic '1' and a second cell of the SRAM, which serves as a reference cell, is programmed with the complement of the first data value, i.e. a logic '0'. The first cell and the second cell share a pair of bitlines such as bitlines BL and BLB in FIG. 1.

In a next step 420, the bitlines are precharged to a predefined voltage, such as the supply voltage $V_{dd}$ or another suitable voltage. Subsequently, in step 430, the wordline of the reference cell is enabled for a predetermined period of time, which may be realized by constantly enabling the wordline for this period or by subjecting the wordline to a number of N pulses, with N being an integer value of at least 2, with the sum of the combined pulse width forming the time period. The latter is advantageous because both N and the pulse width are easily programmable, which facilitates a flexible SRAM test in which a wide range of cell weakness levels can be identified.

The effect of the temporarily enabling of the wordline can be explained by referring to FIG. 1. Assume that the SRAM cell depicted in FIG. 1 is the reference cell. If a logic '0' has been stored in this cell, node 1 will be at a voltage corresponding to the '0' whereas node 2 will be at a voltage corresponding to the inverse (or complement) thereof. Upon enabling the wordline, the bitline that is conductively coupled to the node carrying the voltage corresponding to the logic '0', in this case bitline BLB coupled to node 1, will be partially discharged until a predefined reduced bitline voltage has been reached.

In a next step 440, the word line of the cell under test (CUT) is enabled. Because the cell under test has been programmed with a complement of the data value stored in the reference cell, node 1 of the cell under test will be at a voltage corresponding to a logic '1'. By enabling the wordline of the CUT, this node is exposed to the reduced precharged voltage carried by bitline BLB. This is equivalent to exposing the CUT to a weak overwrite. As explained in FIG. 3 and its description, the data value stored in the CUT will flip to its complementary value if the metastability voltage point Z is higher than the reduced voltage on the bitline. This is evaluated in a next step 450, in which the data stored in the CUT is read out. Subsequently, it is checked in a step 460 if all cells of the SRAM have been tested. Steps 410 to 460 are repeated until the check in step 460 is affirmed.

The steps 410 and 450 may be repeated for a CUT already tested by altering the duration of the enabling of the wordline of the reference cell in step 430, e.g. by altering the number of pulses fed to the wordline of the reference cell, by altering the pulse width of the pulses fed to the reference cell or by altering the duration of an continuous enabling of the wordline, optionally in combination with an alteration of the voltage to which the bitlines are precharged to change the amount of the voltage reduction on the bitline exposed to the node of the reference cell carrying the logic '0'. By subsequently exposing the CUT to this altered reduced voltage, the CUT is tested against an altered SNM threshold. It will be obvious that this process can be repeated a number of times to accurately identify the metastability point and consequently, the SNM of the CUT.

The steps 410 and 450 may also be repeated with the reference cell becoming the CUT, and another cell sharing the bitlines with the former reference cell becoming the reference cell, e.g. the formed CUT. Similarly, the former reference cell may be tested a number of times against various SNM thresholds set by the reduced bitline voltage to accurately determine its metastability point. Thus, for each cell in the SRAM, the SNM can be accurately determined. Thus, the test method of the present invention is very flexible, and allows for the detection of a wide range of defects including defects that are depending of manufacturing process variations, such as data retention faults caused by opens or resistive breaks in the load transistors 106 and 108 of an SRAM cell, and symmetric defects such as breaks in the connections of both load transistors 106 and 108.

Figure 5:
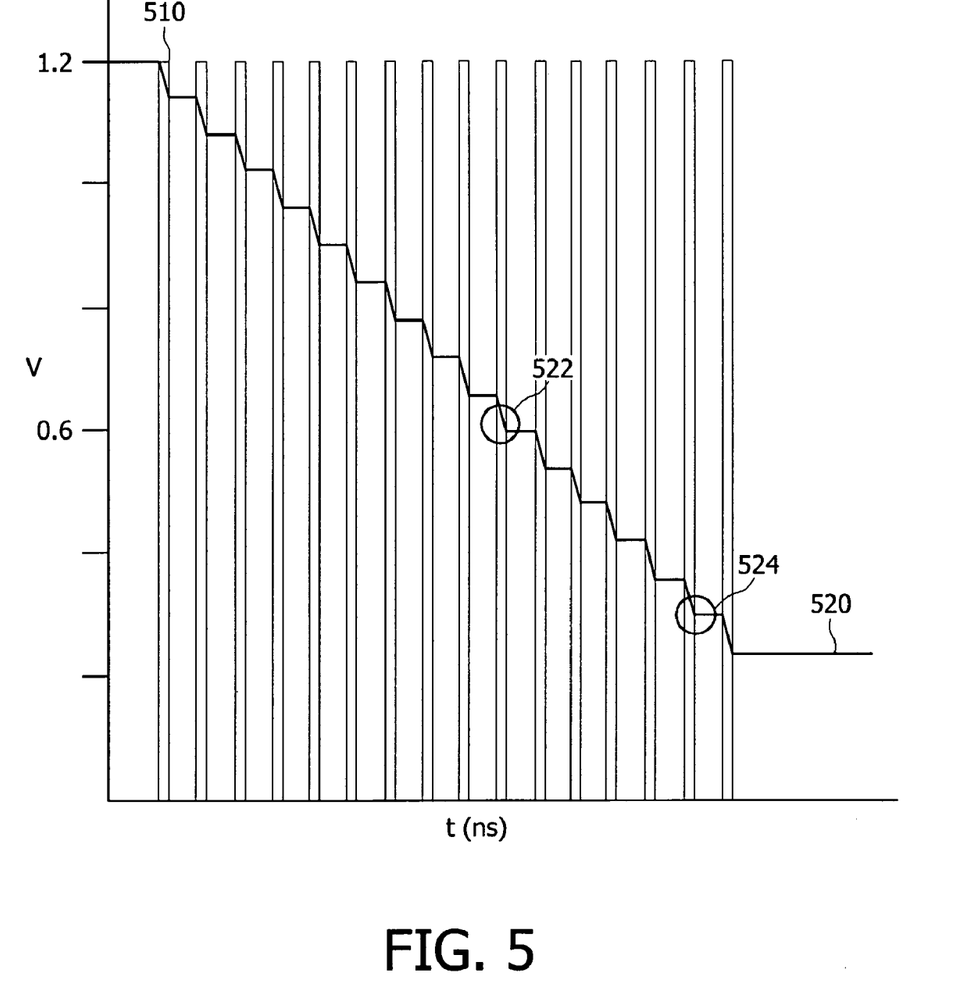
FIG. 5 shows the effect of the method of the present invention on one of the bitlines of the SRAM.

The effect of the enabling of the wordline of the reference cell on the voltage on the bitline is depicted in FIG. 5. Curve 520 represents the voltage on the bitline exposed to the node carrying a logic '0' of the reference cell after enabling the wordline of the reference cell with a pulse 510. A can be seen from FIG. 5, each pulse submitted to the wordline of the reference cell reduces the voltage on the bitline, with the amount of the reduction being proportional to the width of the applied pulse 510. The width of the pulse 510 and the number of applied pulses 510 can be varied to adjust the amount of the voltage reduction on the bitline, as previously explained. For instance, for the function shown in FIG. 5, the application of 10 pulses 510 will reduce the voltage on the bitline to around 600 mV, as indicated by circle 522, whereas the application of 15 pulses 510 will reduce the voltage on the bitline to around 300 mV, as indicated by circle 524. It should be appreciated that by varying the number of pulses and/or the pulse widths (or by varying the width of a single pulse), the CUT can be subjected to a range overwrites with varying strengths to accurately determine its metastability point. It is emphasized that this is a distinct improvement over the prior art, where such high degree of flexibility in the applied overwrite voltages during the SRAM test has not been achieved.

Figure 6:
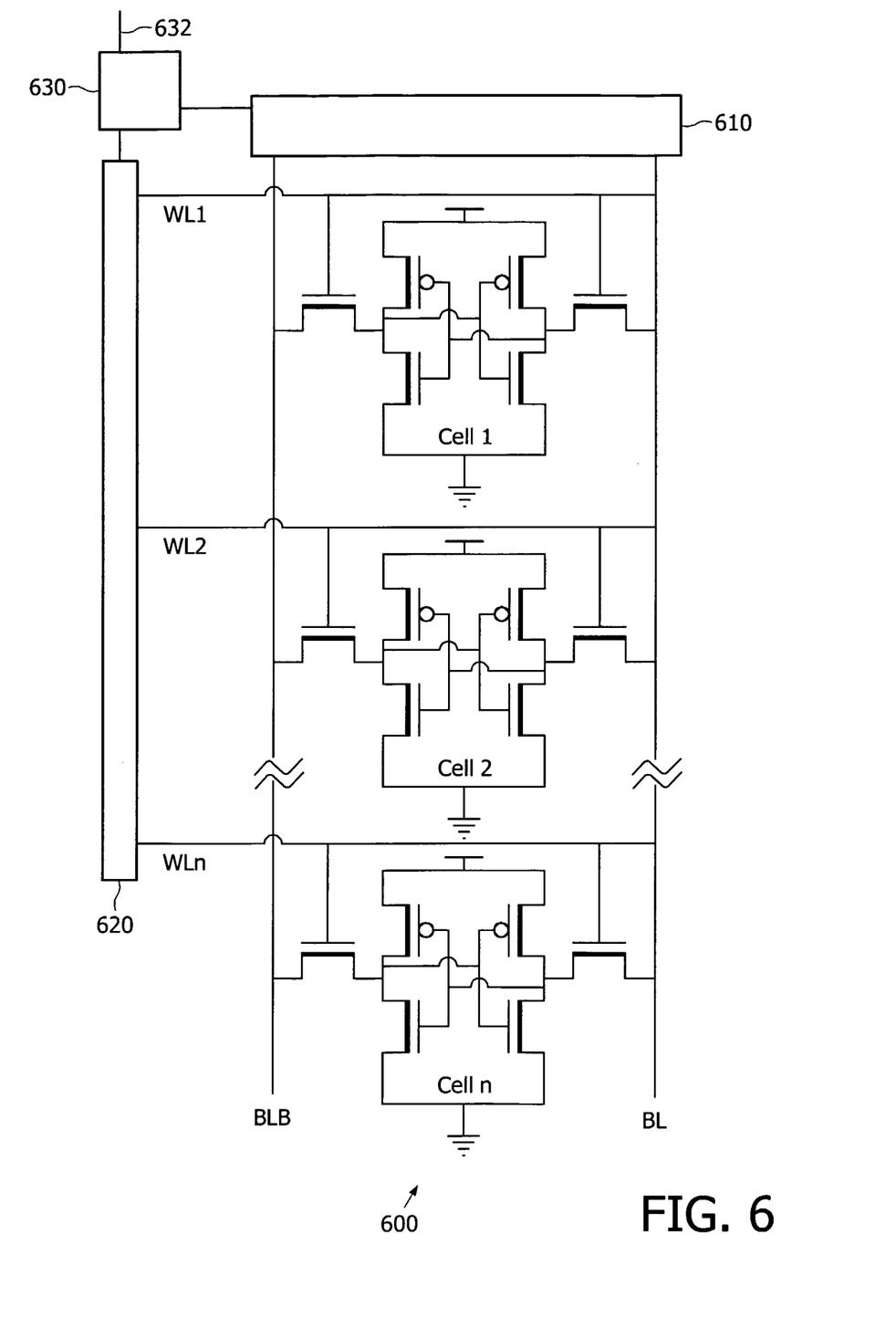
FIG. 6 shows an embodiment of a test arrangement of the present invention.

FIG. 6 shows an embodiment of a test arrangement according to the present invention. An SRAM 600 is schematically and partially depicted by cells 1, 2 and n, with cell n being the $n^{th}$ cell in a column of the SRAM 600. Each of the cells 1-$n$ may for instance be a cell as the 6T SRAM cell shown in FIG. 1 and described in the description thereof. Cells 1-$n$ are coupled between bit lines BLB and BL as described in FIG. 1. The bitlines BLB and BL are coupled to bitline control logic 610, which is configured to precharge the bitlines BLB and BL and to sense the voltages on the bitlines BLB and BL during a read-out of one the cells 1-$n$. The precharge circuitry may for instance be implemented as disclosed in PCT application WO2004/081948. Although depicted as a single functional block 610 in FIG. 6, the precharge circuitry and the read-out circuitry may be implemented by separate circuit blocks.

The test arrangement further comprises wordline control logic 620, which typically comprises an address decoder, coupled to the wordlines WL1-WLn of the cells 1-$n$ for selectively activating a wordline of the SRAM 600. The wordline driver circuitry 620 as well as the driver logic 610 are logic blocks well known in the art, and will not be described further. The test arrangement further comprises a test control block 630 responsive to a test enable line 632 and coupled to bitline control logic 610 and word line control logic 620. The test control block 630 may be integrated on the SRAM 600 or may be a separate test apparatus. Upon activation of the SRAM test, the test control block 630 provides the wordline control logic 620 with the addresses of the cells to be selected as CUT and reference cell respectively, and instructs the bitline control logic 610 to store the appropriate data values in the selected cells.

Subsequently, the test control block 630 is arranged to instruct the bitline control circuit 610 to precharge the bitlines BLB and BL to the predetermined voltage, e.g. $V_{dd}$, after which the test control block 630 triggers the wordline control logic 620 to enable the wordline of the reference cell for a predefined time period, e.g. by providing the wordline of the reference cell with N enable pulses. The test control block 630 may comprise a write-enabled memory (not shown) for storing a value of N, for storing a value of the pulse width of the wordline enable pulse or for storing a duration of a continuous wordline enable signal, or combinations thereof. The memory of the test control block 630 may be externally accessible, to allow updates of these test parameters, for instance during testing.

Subsequently, the test control block 630 provides the wordline control logic 620 with the address of the CUT, and upon enabling of the wordline of the CUT, the test control block 630 instructs the bitline control logic 610 to read the data value stored in the CUT. This data value is forwarded to the test control block 630, which compares the retrieved data value with the data value initially stored in the CUT. The test control block 630 may store a CUT pass/fail indicator, the determined SNM of the CUT or a combination of these results in a memory, or may immediately output this information via an output channel (not shown), e.g. a test bus.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method for testing a static random access memory having a first cell and a second cell coupled between a first bitline and a second bitline, the first cell being responsive to a first wordline and the second cell being responsive to a second wordline, the method comprising:
   testing the first cell, the testing the first cell comprising:
      storing a data value in the first cell;
      storing the complement of the data value in the second cell;
      charging at least one of the first bitline and the second bitline to a predefined voltage;
      enabling the second wordline for a predefined time period after the complement of the data value has been stored in the second cell;
      enabling the first wordline; and
      evaluating the data value stored in the first cell.

2. The method of claim 1, wherein enabling the second wordline for a predefined time period comprises providing the second wordline with N voltage pulses having a combined pulse width corresponding to the predefined time period, with N being an integer and being at least 2.

3. The method of claim 2, further comprising selecting a value of N.

4. The method of claim 2, comprising defining the pulse width.

5. The method of claim 1, further comprising:
   storing a further data value in the first cell;
   storing the complement of the further data value in the second cell;
   charging at least one of the first bitline and the second bitline to a further predefined voltage;

enabling the second wordline for a further predefined time period; enabling the first wordline; and evaluating the further data value stored in the first cell.

6. The method of claim 1, further comprising:

storing a second further data value in the first cell;

storing the complement of the data value in the second cell;

charging at least one of the first bitline and the second bitline to a predefined voltage;

enabling the first wordline for a predefined time period; enabling the second wordline; and evaluating the data value stored in the second cell.

7. A test arrangement for testing a static random access memory having a first cell and a second cell coupled between a first bitline and a second bitline, the first cell being responsive to a first word line and the second cell being responsive to a second wordline, the test arrangement comprising:

means for testinci the first cell, the means for testing the first cell comprising:

means for storing a data value in the first cell;

means for storing the complement of the data value in the second cell;

means for charging at least one of the first bitline and the second bitline to a predefined voltage;

means for enabling the second word line for a predefined time period after the complement of the data value has been stored in the second cell;

means for enabling the first word line; and means for evaluating the data value in the first cell.

8. The test arrangement of claim 7, wherein the means for enabling the wordline of the second cell for a predefined time period comprise means for providing the second wordline with N voltage pulses having a combined pulse width corresponding to the predefined time period, with N being an integer and being at least 2.

9. The test arrangement of claim 8, wherein N is configurable.

10. The test arrangement of claim 8, wherein the pulse width is configurable.

11. The test arrangement of claim 7, wherein the test arrangement is integrated in the static random access memory.

* * * * *